United States Patent
Bleau et al.

(10) Patent No.: US 7,116,553 B2
(45) Date of Patent: Oct. 3, 2006

(54) CIRCUIT BOARD ENCLOSURE

(75) Inventors: Charles Bleau, Atlanta, GA (US);
Mark P. McJunkin, Atlanta, GA (US);
Dean Quoc Nguyen, Atlanta, GA (US);
Garry Thomas Motter, Stone Mountain, GA (US); Raymond C. DuVarney, Lilburn, GA (US)

(73) Assignee: SciMeasure Analytical Systems, Inc., Decatur, GA (US)

( * ) Notice: Subject to any disclaimer, the term of this patent is extended or adjusted under 35 U.S.C. 154(b) by 68 days.

(21) Appl. No.: 10/982,070

(22) Filed: Nov. 5, 2004

(65) Prior Publication Data

US 2005/0099769 A1 May 12, 2005

Related U.S. Application Data

(60) Provisional application No. 60/518,262, filed on Nov. 7, 2003.

(51) Int. Cl.
*H05K 7/20* (2006.01)
(52) U.S. Cl. .................. 361/690; 361/683; 361/727; 361/790; 361/730; 361/732; 361/735; 439/74
(58) Field of Classification Search .............. 361/690, 361/729–735, 784, 785, 790, 791, 803, 748, 361/752, 756, 759, 760, 765, 807; 439/76.1, 439/76.2, 483, 44, 45, 47, 68, 69, 74; 312/223.1, 312/223.2, 223.3; 174/59, 60, 65 R, 16.1, 174/52.1, 52.4, 258, 255; 257/685, 686, 257/690, 698
See application file for complete search history.

(56) References Cited

U.S. PATENT DOCUMENTS

| | | | | |
|---|---|---|---|---|
| 4,688,864 A | * | 8/1987 | Sorel | .................. 439/74 |
| 5,057,971 A | * | 10/1991 | Hautvast et al. | ............ 361/740 |
| 5,067,040 A | * | 11/1991 | Fallik | .................. 361/687 |
| 5,335,144 A | * | 8/1994 | Maroushek | .................. 361/695 |
| 5,602,721 A | | 2/1997 | Slade et al. | |
| 5,645,434 A | * | 7/1997 | Leung | .................. 439/74 |

(Continued)

FOREIGN PATENT DOCUMENTS

DE 3932000 A * 4/1991

(Continued)

OTHER PUBLICATIONS

LUDL ELECTRONIC PRODUCTS, It Looks Different. . ., "The MAC 5000 system is the new standard in modular automation for scientific applications." http://www.ludl.com/Products/BioScience/MAC50000/MAC5000Start.html; total p. 1.

(Continued)

*Primary Examiner*—Michael Datskovskiy
(74) *Attorney, Agent, or Firm*—Alston & Bird LLP

(57) ABSTRACT

The invention provides an expandable modular enclosure system for enclosing circuit boards connected by a stackable bus. The enclosure system includes one or more carriers and spacers, a base unit, and a top unit. The spacers and carriers are alternately stacked between the base unit and top unit, and each circuit board is mounted to a carrier. A side portion with recessed vents extends from one side of each carrier, and each carrier and spacer define an opening. Air flows through the vents, over each circuit board, and through the openings in the carrier to cool the circuit boards. Circuit boards with varying functionality can be included in the enclosure, and as many circuit boards as are necessary can be enclosed without increasing the size of the footprint of the enclosure.

37 Claims, 9 Drawing Sheets

U.S. PATENT DOCUMENTS

| | | | |
|---|---|---|---|
| 5,838,548 A | | 11/1998 | Matz et al. |
| 5,864,467 A | * | 1/1999 | Recchia et al. ............. 361/732 |
| 6,038,126 A | | 3/2000 | Weng |
| 6,056,256 A | * | 5/2000 | Ponce ................... 248/346.01 |
| 6,201,709 B1 | * | 3/2001 | Justiniano et al. .......... 361/790 |
| 6,328,612 B1 | * | 12/2001 | Chung ........................ 439/717 |
| 6,493,230 B1 | * | 12/2002 | Clidaras et al. ............. 361/730 |
| 6,698,851 B1 | | 3/2004 | Ludl |
| 6,760,218 B1 | * | 7/2004 | Fan ............................ 361/683 |
| 6,968,958 B1 | * | 11/2005 | Lauchner et al. ............. 211/26 |
| 2002/0089820 A1 | * | 7/2002 | Abboud ...................... 361/685 |

FOREIGN PATENT DOCUMENTS

| | | | |
|---|---|---|---|
| DE | 1000 13 134 A 1 | * | 9/2001 |
| GB | 2 118 788 A | * | 11/1983 |

OTHER PUBLICATIONS

LUDL ELECTRONIC PRODUCTS, MAC5000 Controller System Catalog, total p. 20.

* cited by examiner

CIRCUIT BOARD ENCLOSURE

CROSS-REFERENCE TO RELATED APPLICATIONS

This application claims priority from provisional application No. 60/518,262 entitled "Circuit Board Enclosure," which was filed on Nov. 7, 2003 and which is hereby incorporated by reference.

FIELD OF INVENTION

The field of the present invention includes apparatuses for enclosing circuit boards for their protection. Such apparatuses can be used for a variety of applications, including a circuit board enclosure for controlling a camera used in imaging contexts.

DESCRIPTION OF RELATED ART

Enclosures are used to protect circuit boards from damage due to dust, shock, wear, debris, or ambient conditions, for example. Enclosures can also serve to house a bus utilized by a plurality of circuit boards to transmit electrical and/or optical signals and power to the components of the circuit boards. Two approaches that exist in the art for providing enclosures include the use of: (1) backplanes and (2) stackable modules.

A backplane has a planar configuration with a bus of parallel conductive lines that are attached to spaced connectors or "slots" configured to receive a connector of a circuit board. The backplane can be configured to include one to twenty-one slots for supporting an equal number of circuit boards. Circuit boards fit into the slots and plug into the connectors on the backplane, and the backplane provides power and data signals to the circuit boards. This type of enclosure is limited to the number of slots provided by each enclosure. If more slots are needed, an expansion module has to be added to the main backplane. If fewer slots are needed, an air baffle can be used to occupy the position of an empty slot. Determining the number of circuit boards that will be needed for a particular controller or electronic module can be difficult and expensive, especially for specialized or frequently changing operations that necessitate changing the circuit boards to obtain desired functionality for different applications in which the circuit boards are used. Furthermore, because the slots are manufactured to accept circuit boards of a particular dimension, circuit boards that do not have the particular dimensions are not mountable within the backplane enclosure, and this drawback hinders the functionality and modularity of the enclosure.

A second approach is to use stackable modules to provide an enclosure and bus for circuit boards. An example of a stackable module enclosure is the MAC 5000 Controller System manufactured by Ludl Electronics Products Ltd. (LEP). In the MAC 5000 system, a plurality of circuit boards are integrated into a single controller that can communicate with a computer via a standard RS-232 or USB port. The system has a top part, a base part that includes a power outlet and a fan, and stackable modules, which hold the circuit boards. The circuit boards and stacker modules that contain them are dedicated to serving a particular function. For example, the system offers XY stepper motor stage controller modules, XY DC servo motor stage controllers, standard stepper filter wheel controller, and high-speed DC filter wheel controllers. Problems with this system include the lack of interchangeability among the stacker modules and the inability of the stacker modules to contain circuit boards that perform functions not offered by LEP.

The MAC 5000 system also utilizes a stacking technique of having two prongs in the underside of the front of the upper stacker module that latch into the upper side of the front of the lower stacker module. Two screws are then fed through the back of the upper stacker module into a side that goes all the way around the top of the lower stacker module. This technique can be burdensome if several modules are involved. Furthermore, some of the stackers have slots machined in them for cooling the circuit boards. However, the machining process can be a difficult operation.

Embodiments of the present invention overcome many of the challenges present in the art, some of which are presented above.

SUMMARY OF THE INVENTION

The present invention provides an expandable modular enclosure which makes possible the enclosure of a variable number of circuit boards that can perform a wide range of functions with an integrated cooling system for the circuit boards.

In one embodiment of the invention, the enclosure is a carrier that has at least one recess to facilitate airflow to or from a circuit board mounted on the carrier and at least one mounting portion for securing the circuit board to the carrier. In one embodiment, the mounting portions define apertures for receiving screws to secure the circuit board to the carrier. Alternatively, the mounting portions can be spring-loaded clips for receiving the circuit board.

In an alternative embodiment of the invention, the enclosure includes a spacer and a carrier. The spacer has a wall and an engagement portion for stacking the carrier onto the spacer. The carrier has at least one mounting portion for mounting a circuit board to the carrier and an engagement portion that is adapted for mating with the engagement portion of the spacer so the spacer and carrier can be stacked and aligned relative to one another. The mounting portions can be similar to the mounting portion embodiments discussed above. The engagement portion on the spacer can be a lip that mates with a groove on the carrier where the lip and groove fit together to keep the spacer and carrier in a fixed relationship relative to one another. In an alternative embodiment of the engagement portion, the groove can be on the spacer and the lip on the carrier. In yet another alternative embodiment of the engagement portion, the spacer can have a protrusion and the carrier can have a recess for receiving the protrusion when the spacer and carrier are stacked relative to one another.

In a preferred embodiment of the invention, the enclosure includes a base unit, a top cover, and a plurality of stackable enclosure units. The base unit has a floor and walls, and the top edges of the walls have an engagement portion. The top cover has an upper and lower side and an engagement portion on the lower side. The plurality of stackable enclosure units each includes a spacer and a carrier where the spacer and carrier have engagement portions such as those described above. In one embodiment, the engagement portions are a lip and groove arrangement that can mate with a corresponding groove and lip arrangement on another engagement portion so that when engagement portions are mated and aligned, a plurality of stackable enclosure units assembled between the base unit and the top cover form an enclosure for the circuit boards.

These and other aspects of the various embodiments of the invention are disclosed more fully herein.

BRIEF DESCRIPTION OF THE DRAWINGS

Figure 1:
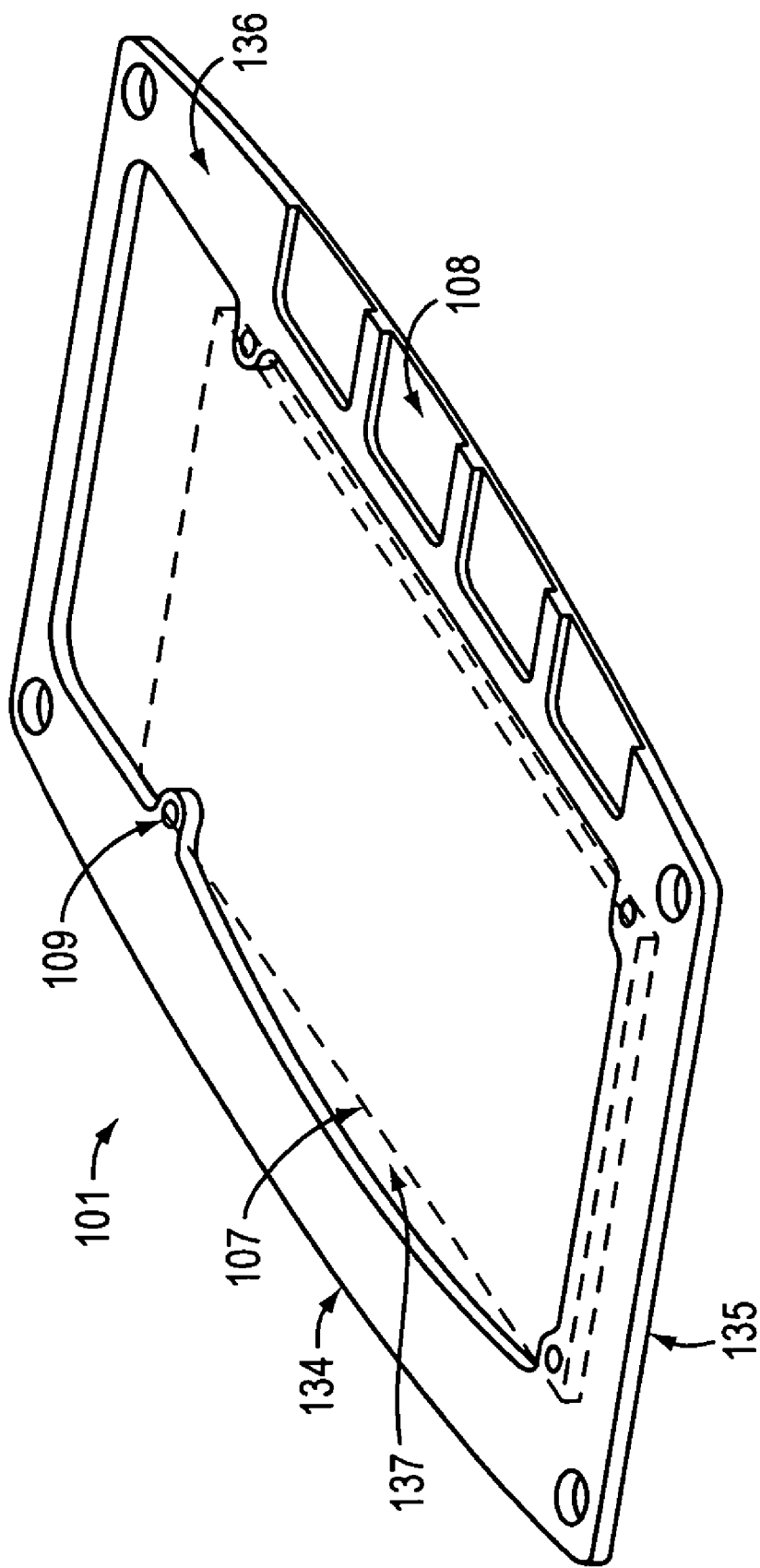

Having thus described the invention in general terms, reference will now be made to the accompanying drawings, which are not necessarily drawn to scale, and wherein:

FIG. 1 shows a perspective view of a carrier according to one embodiment.

Figure 2:
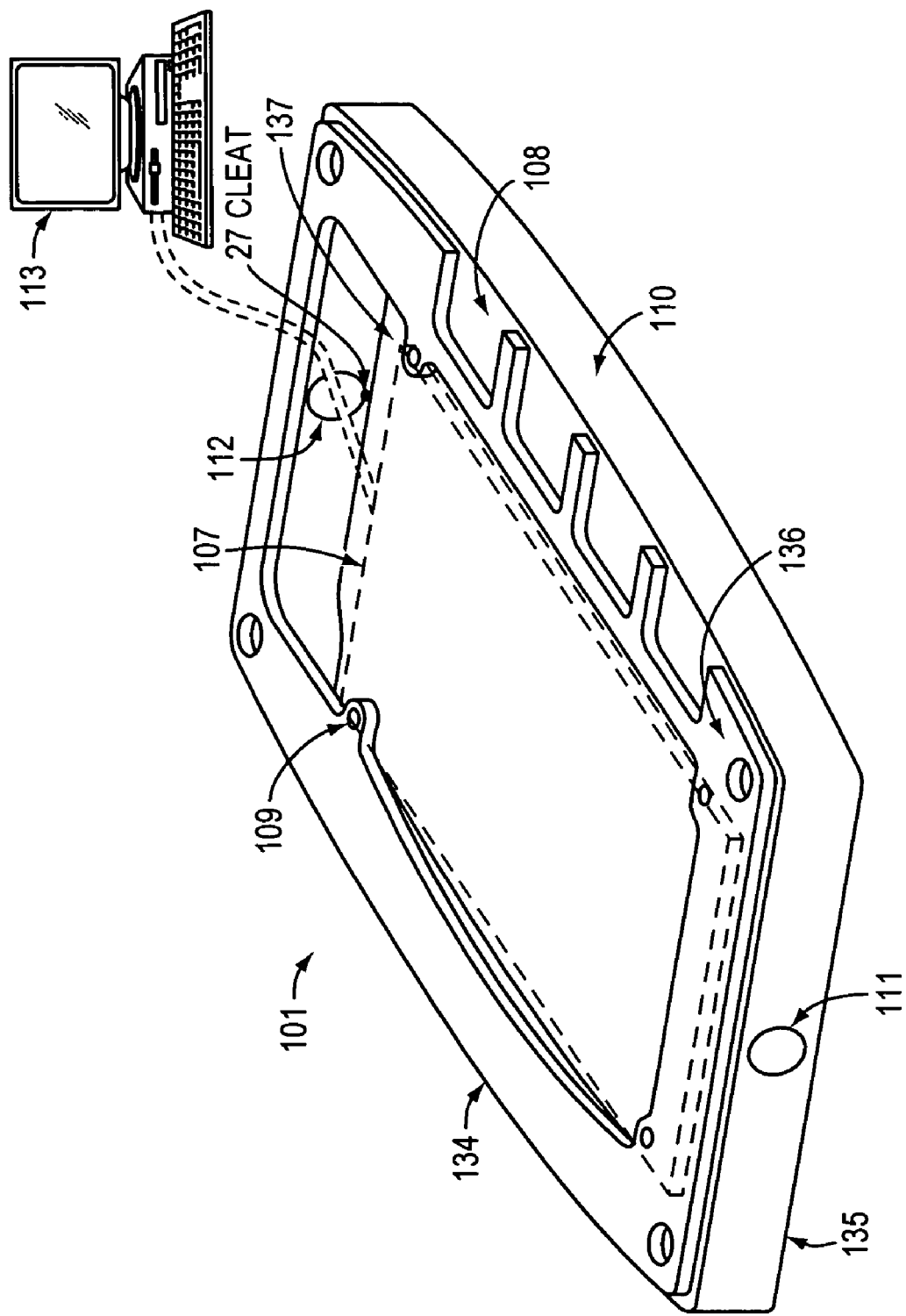

FIG. 2 shows a perspective view of a carrier according to one embodiment.

Figure 3:
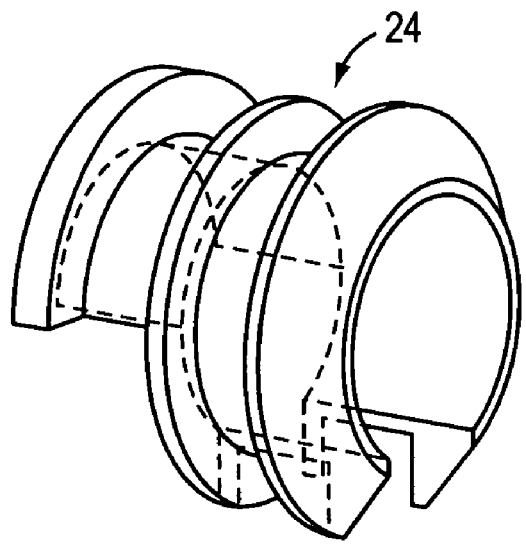
Figure 3:
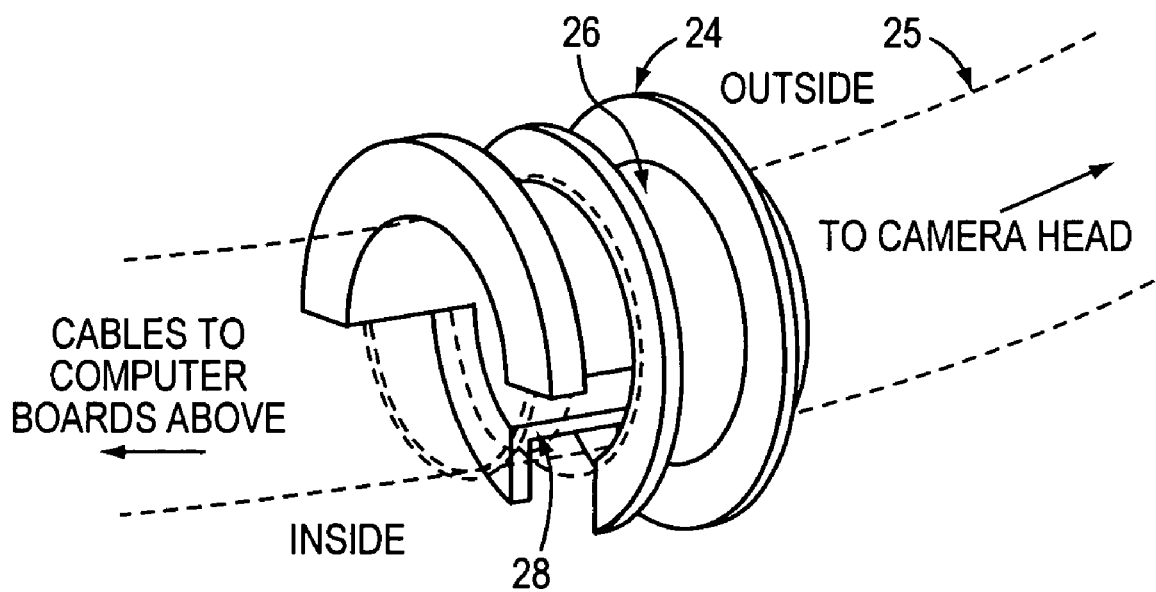

FIG. 3 shows a perspective view of a bushing according to one embodiment.

Figure 4:
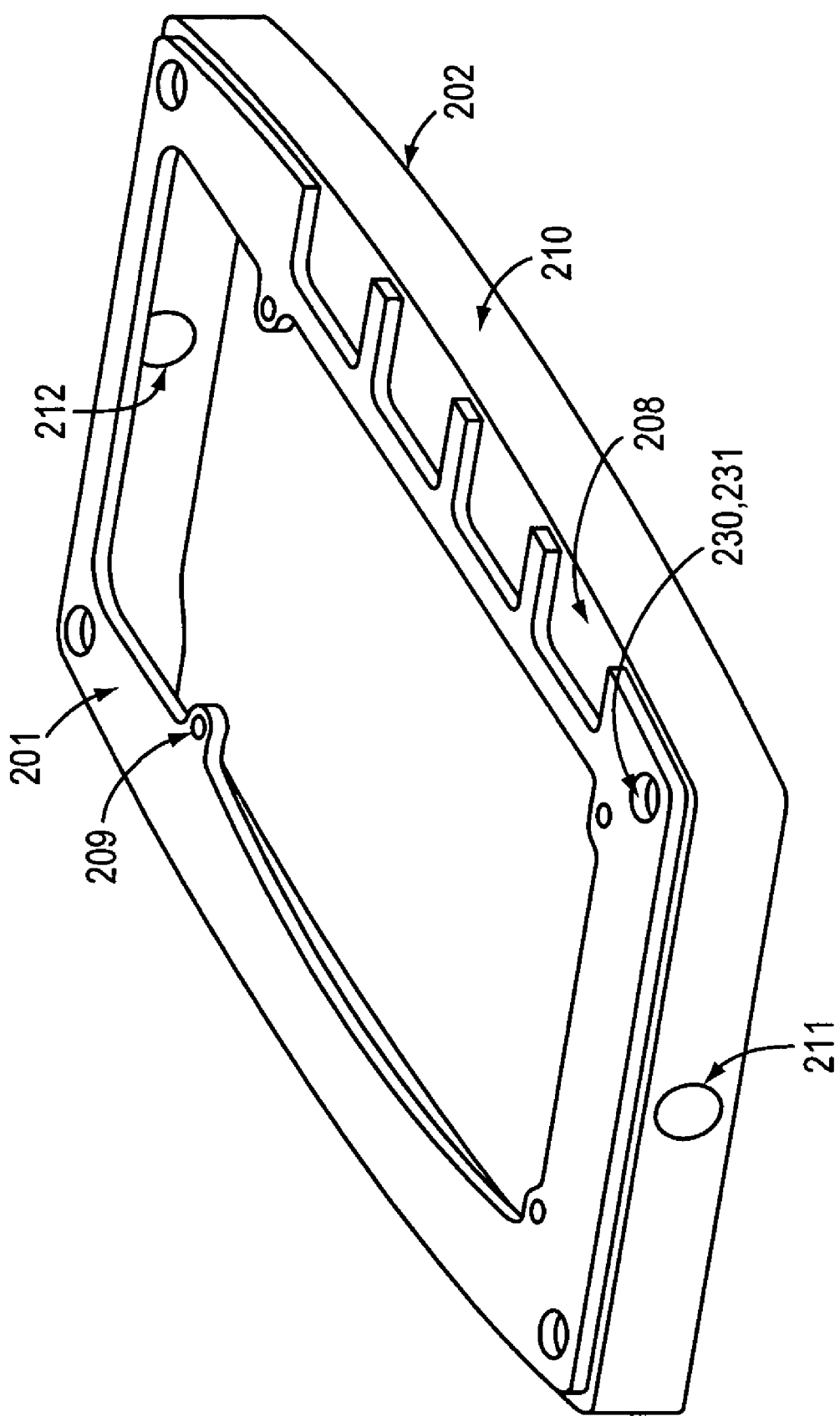

FIG. 4 shows a perspective view of an assembled spacer and carrier according to one embodiment.

Figure 5:
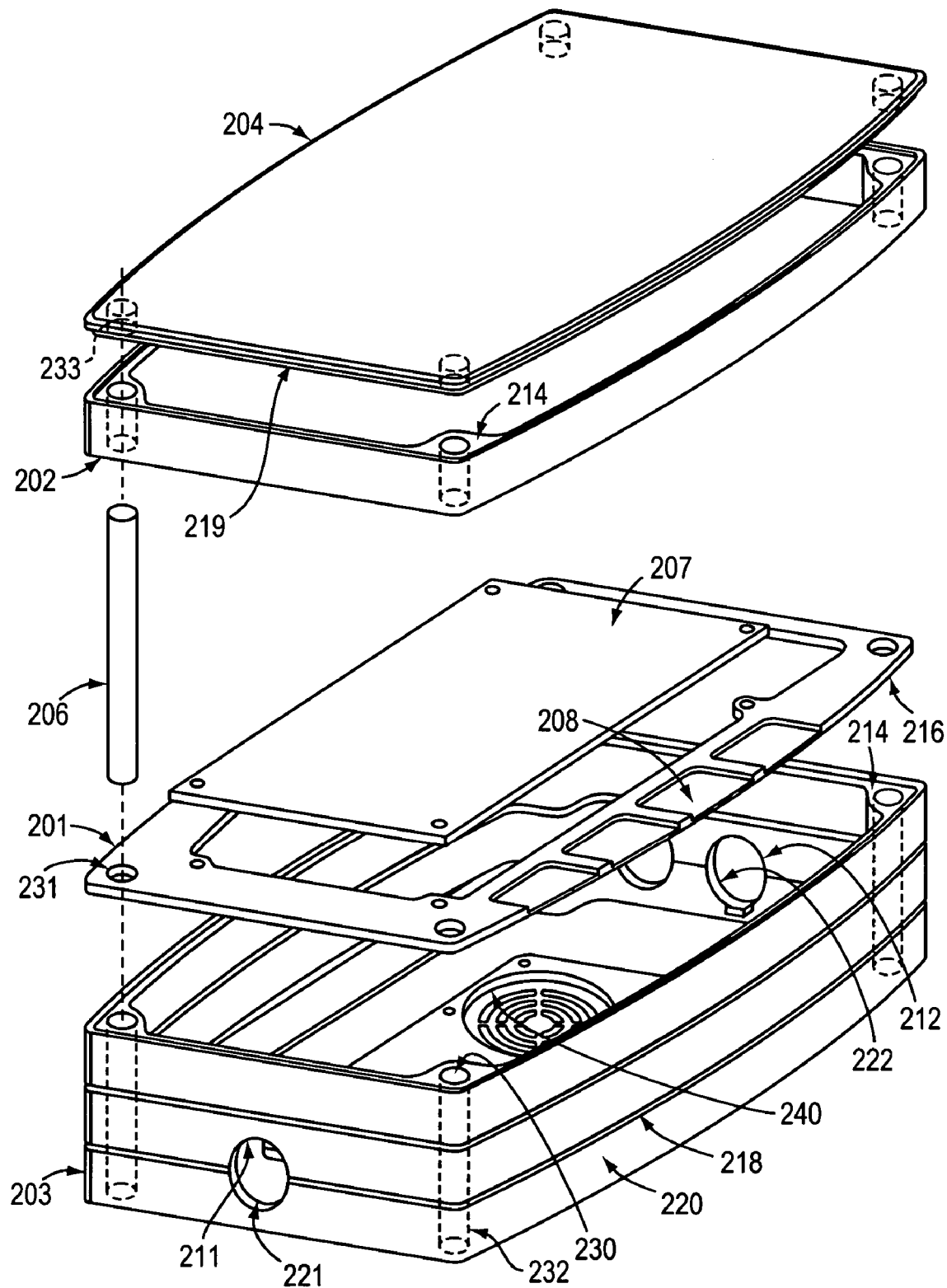

FIG. 5 shows a perspective view of a spacer, carrier, base unit, and top cover according to one embodiment.

Figure 6:
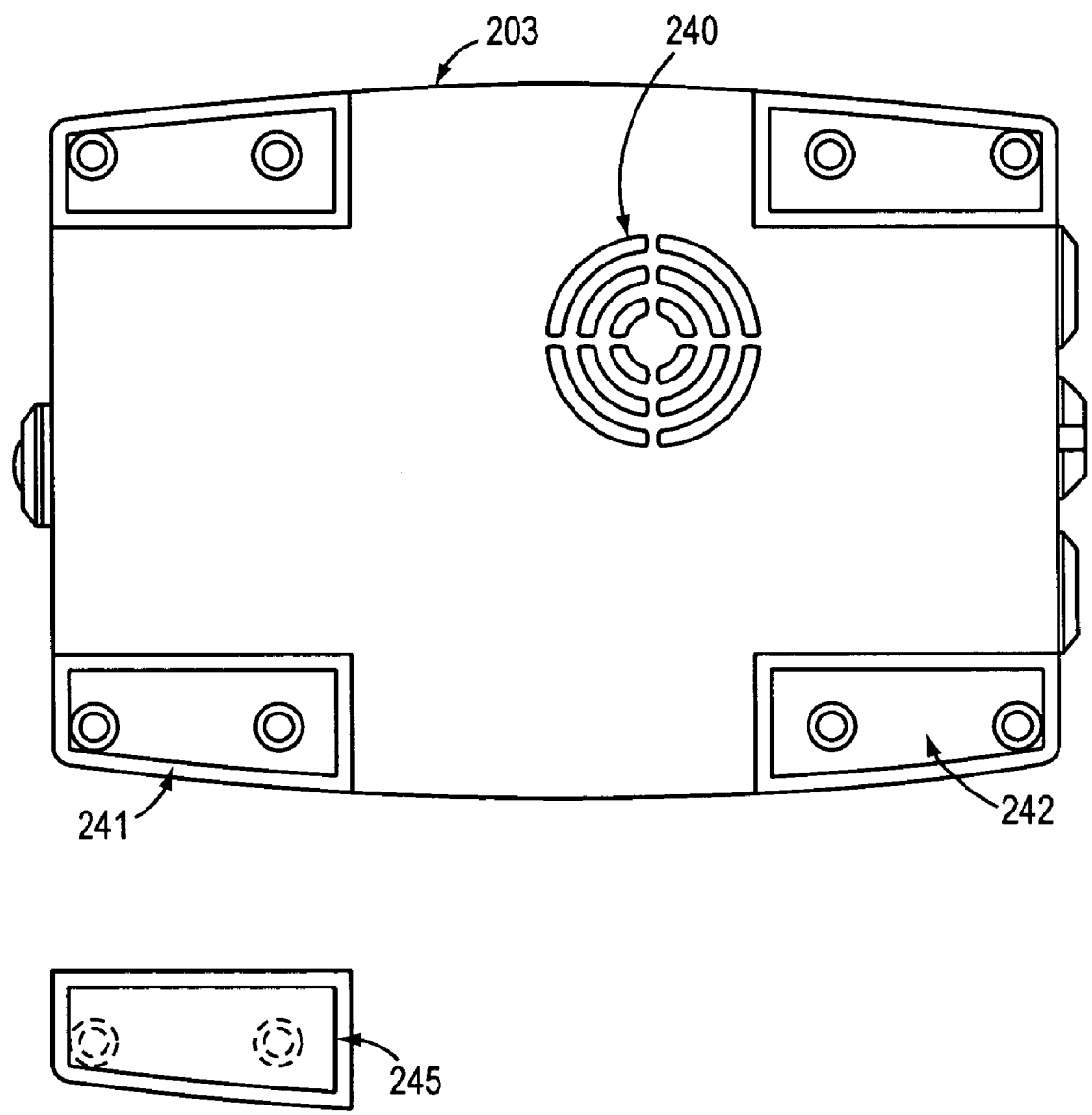

FIG. 6 shows a bottom view of a base unit according to one embodiment.

Figure 7:
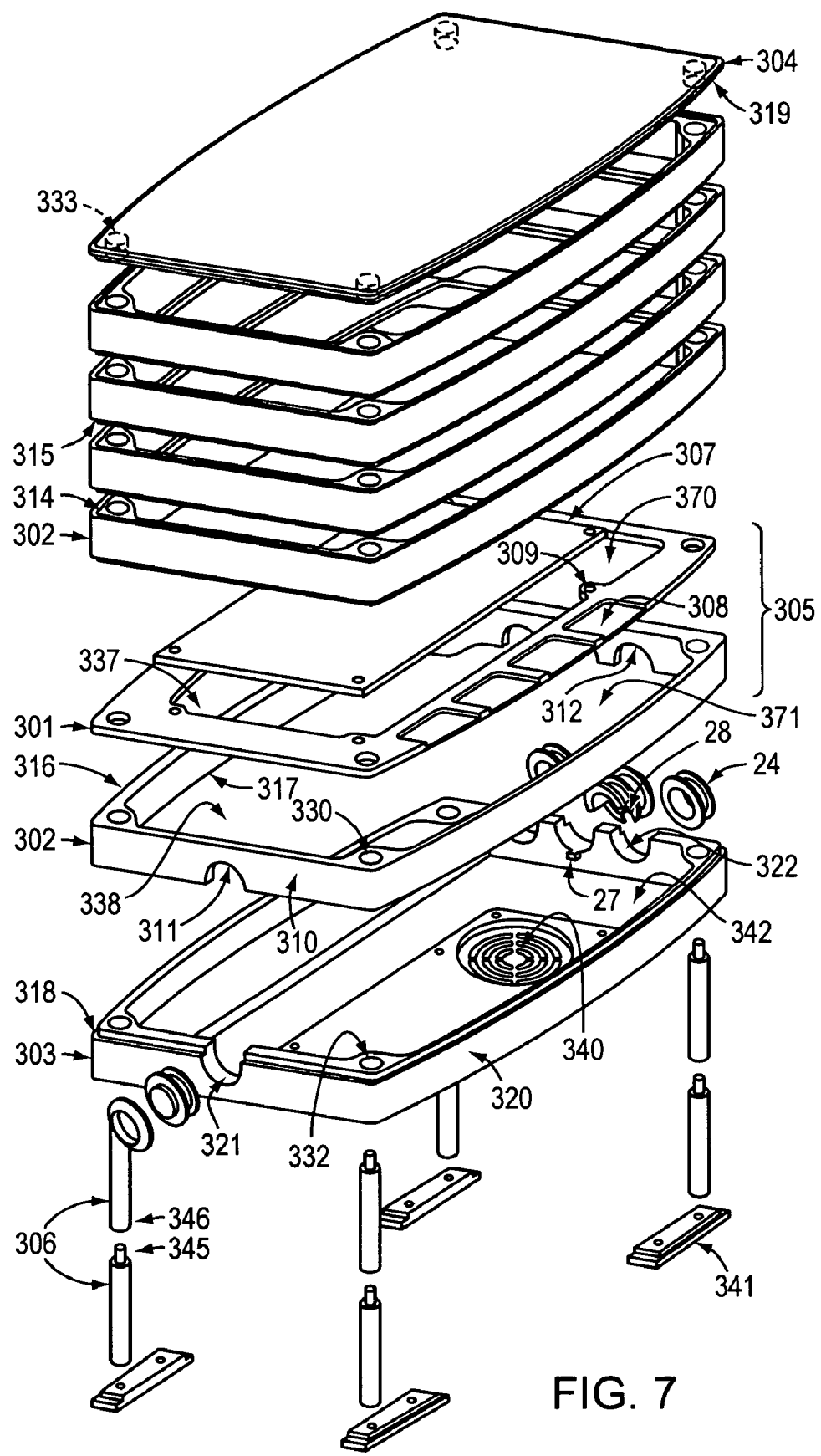

FIG. 7 shows an exploded view of an assembled enclosure according to one embodiment.

Figure 8:
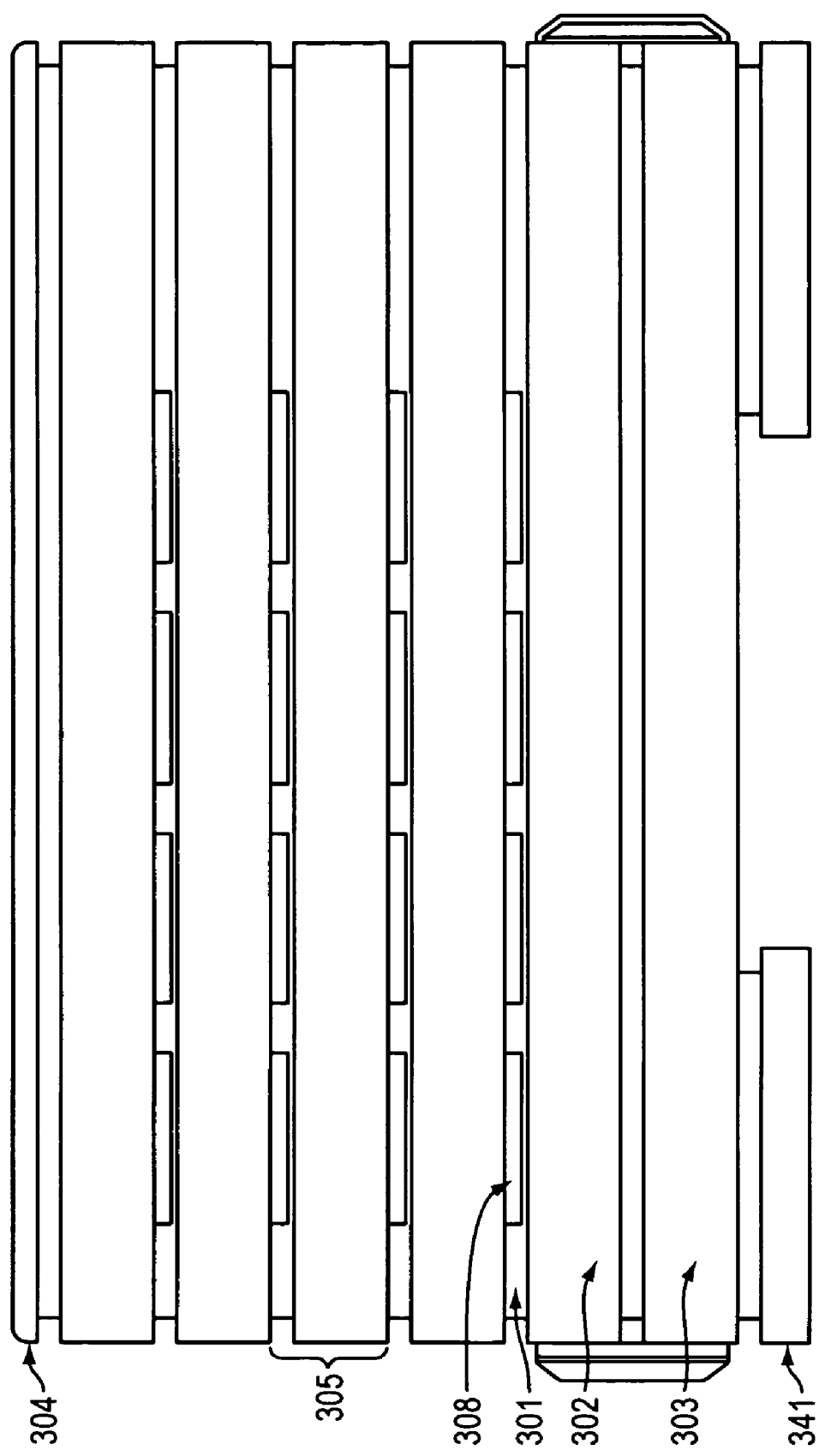

FIG. 8 shows a side view of an assembled enclosure according to one embodiment.

Figure 9:
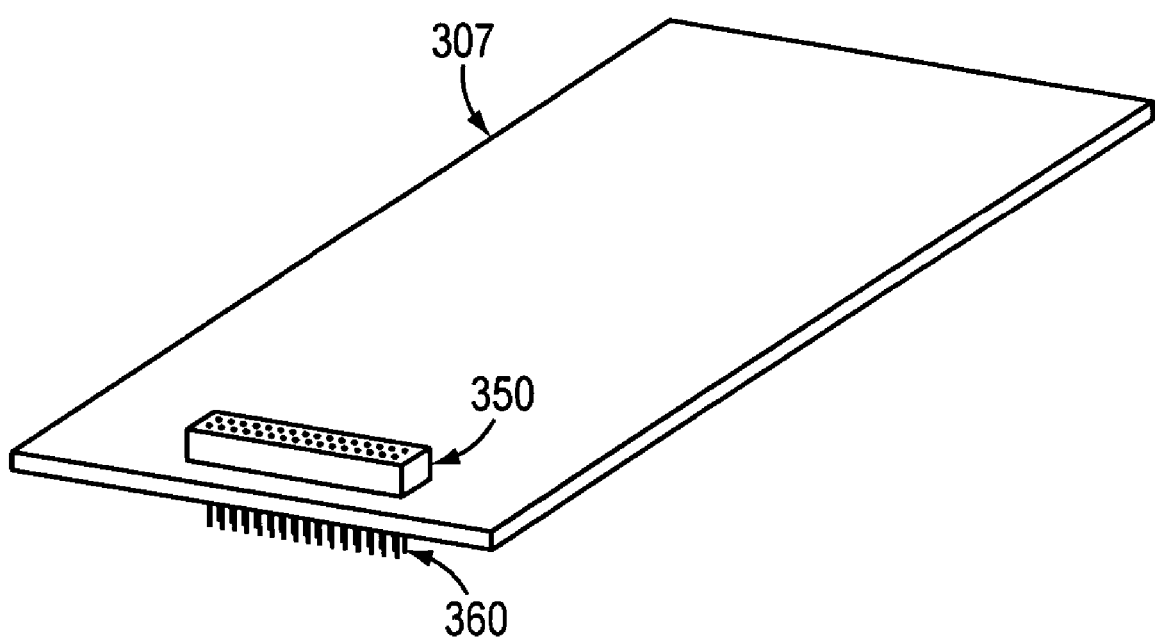

FIG. 9 shows a perspective view of a circuit board with connectors according to one embodiment.

DETAILED DESCRIPTION OF THE DRAWINGS

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Generally, the subject matter of the various embodiments of the invention relate to an apparatus for enclosing at least one circuit board. In an embodiment as shown in FIGS. 1 and 2, the enclosure is a carrier 101 with at least one recess 108 for facilitating airflow to or from a circuit board 107 that is secured to the carrier 101 and at least one mounting portion 109 that is configured to receive and secure a circuit board 107. In one embodiment, the mounting portion 109 defines one or more apertures for receiving screws to secure the circuit board 107 to the carrier 101. Additional embodiments of the mounting portion 109 include spring-loaded clips for receiving the circuit board 107, snaps for receiving mating snap members on the circuit board 107, or any suitable fastener known in the art for securing a circuit board 107 to a carrier 101.

According to one embodiment, the carrier 101 is planar shaped, having a rectangular portion with two opposing, relatively long sides 134 and two opposing, relatively short sides 135. A planar side portion 136 depends from one of the sides 134, 135 and includes at least one recess 108 for facilitating airflow to or from the circuit board 107. In one embodiment, the recess 108 is defined in the side portion 136 so that the recess 108 has a thinner cross-section than the cross section of other areas of side portion 136. The recess 108 can be defined in the side portion 136 so that the cross section of the recess 108 gradually increases from relatively deep at the edge of the side portion 136 of the carrier 101, to relatively shallow closer to the mounting portion of the carrier 101.

In a further embodiment, the carrier 101 has an opening 137 for receiving the circuit board 107 and allowing air to flow around the circuit board 107. In one embodiment, the opening 137 is dimensioned larger than the circuit board 107 so that when a plurality of carriers 101 are stacked relative to one another, the openings 137 form a flue in which air can flow adjacent the circuit boards 107 mounted to the carriers 101. In one embodiment, the rectangular configuration of the circuit board 107 can measure 100 millimeters on the short sides and 160 millimeters on the long sides.

In an alternative embodiment, the opening 137 is positioned on the carrier to at least partially extend past an edge of the circuit board 107. Similar to the embodiment described above, when a plurality of carriers 101 are stacked relative to one another, the openings 137 form a flue through which air can flow adjacent the circuit boards 107 mounted to the carriers 101.

In another embodiment, shown in FIG. 2, a wall 110 is formed integrally with and extends perpendicular from the major surfaces of the carrier 101. In a further embodiment, the wall 110 defines at least one opening 112 through which at least one cable can be run to connect the circuit board 107 to an external device and enable communication between them. In one embodiment, the carrier 101 is stacked relative to a base unit, like the embodiments discussed in relation to FIGS. 4 through 8, and the wall 110 of the carrier 101 has a partial opening that aligns with a partial opening of a base unit. The partial openings define an opening when the carrier is stacked adjacent to the base unit, and at least one cable can be run through the opening to connect the circuit board 107 to an external device 113 and enable communication between them.

A further embodiment includes the use of a bushing 24 to further secure cables from the circuit board 107. In one embodiment of a bushing 24 as shown in FIG. 3, the bushing 24 has a central groove 26 that mates with the opening 112 in the carrier wall 110 or in the opening defined by the aligned portions of the carrier 101 and a base unit. As shown in FIGS. 2 and 7, adjacent the defined opening 112, 322 is a cleat 27, and the bushing 24 has a C-shaped retaining portion 28 that mates with the cleat 27. The retaining portion 28 of the bushing 24 engages with the cleat 27 when circumferential force is applied inwardly on the bushing 24. When this force is applied, the bushing 24 contracts around cable run through it and more securely holds the cables in the opening. In one embodiment, the circumferential force on the bushing 24 can be engaged by threading a wire tie around the bushing 24 and cables and pulling the wire tie taut.

In one embodiment, shown in FIG. 4, the wall 110 in the carrier 101 includes an opening 111 into which an indicator light can be mounted. In an alternative embodiment in which a carrier 101 is stacked relative to a base unit, like the embodiments discussed in relation to FIGS. 4 through 7, the wall 110 of the carrier 101 has a partial opening that aligns with a partial opening on a base unit when the carrier 101 is stacked relative to the base unit. The partial openings define an opening into which a light can be mounted. This light could be useful in indicating whether the circuit board is receiving power or whether a signal is received or is being sent by the circuit board, and is electrically connected to the circuit board, the power supply, or both, as appropriate to serve as such an indicator.

In an alternative embodiment of the invention as shown in FIGS. 4 and 5, the enclosure includes a spacer 202 and a carrier 201. The spacer 202 has a wall 210 with an engagement portion 214. The carrier 201 defines at least one mounting portion 209, which is configured for mounting to a circuit board 207, and has an engagement portion 216 adapted for mating with the engagement portion 214 of the spacer 202 to facilitate alignment of the spacers 202 and carriers 201 relative to one another. The mounting portion 209 of the carrier 201 can have any of the mounting portion embodiments discussed relating to the embodiments in FIGS. 1 and 2.

In one embodiment, the engagement portion 214 of the spacer 202 has at least one of a lip and groove portion that mates with at least one of a corresponding groove and lip portion of the carrier 201. In an alternative embodiment, the engagement portion 214 of the spacer 202 has at least one of a spring latch and a latch-receiving member that mates with at least one of a corresponding latch-receiving member and a spring latch of the carrier 201. An additional alternative embodiment includes the spacer 202 having a protrusion and the carrier 201 having a recess for receiving the protrusion when the spacer 202 and carrier 201 are stacked relative to one another. For any of these engaging embodiments, the spacer 202 and the carrier 201 are aligned in a fixed relationship relative to one another when the engagement portions 214, 216 of the spacer 202 and carrier 201 are mated together. Other engaging devices sufficient for aligning stackable enclosures in a fixed relationship are known in the art and may be utilized for this invention.

In another embodiment, as shown in FIG. 5, the spacer 202 has apertures 230 that align with apertures 231 in the carrier 201 such that when a member 206 is threaded through the apertures 230, 231, the spacer 202 and carrier 201 are aligned and secured relative to one another. This embodiment can be implemented on its own or in combination with the engaging embodiments discussed above.

Further, like the embodiments discussed in relation to FIGS. 1 and 2, in one embodiment, the wall 210 of the spacer 202 has at least one opening 211 for receiving an indicator light and at least one opening 212 through which at least one cable can be run to connect the circuit board 207 to an external device for enabling communication between them. In an alternative embodiment in which a spacer 202 is stacked relative to a base unit 203, as discussed in more detail below, the wall 210 of the spacer 202 has a partial opening 211, 212 that aligns with a partial opening 221, 222, respectively, of a base unit 203 so that when the spacer 202 is stacked relative to the base unit 203 and the partial openings are aligned, an opening is defined. A light can be mounted in the opening or cables can be run through the opening. A further embodiment includes the use of a bushing 24, such as is discussed above in relation to FIGS. 2 and 3, to further secure cables from the circuit board.

In one embodiment, a base unit 203 is used to further enclose the circuit board 207, as shown in the embodiments in FIGS. 5 and 6. The base unit 203 has a wall 220 that is configured to receive the spacer 202. In one embodiment, the wall 220 can be configured to include an engagement portion 218 similar to the engagement portions embodiments discussed above for the spacer 202 in reference to FIGS. 4 and 5. As an alternative embodiment or in addition to the embodiments described above, the base unit 203 defines apertures 232 that align with apertures 230, 231 in the spacer 202 or carrier 201, or both, such that when a member 206 is threaded through the apertures 230, 231, 232, the base unit 203, spacer 202, and carrier 201 are aligned and secured relative to one another.

A further embodiment of the base unit 203 includes a fan 240 for generating airflow to the circuit board 207. Additional embodiments of the base unit 203 include at least one opening 221 in the wall 210 into which an indicator light can be mounted and at least one opening 222 through which a cable can be run to enable communication between the circuit board 207 and an external device.

In another embodiment of the base unit, at least one foot member 241 is mounted to the underside of the base unit 203 to support the enclosure apparatus, as shown in FIG. 6. In one embodiment, the foot member 241 defines a shell 242 that receives a rubber pad 245 and holds the rubber pad 245 in a fixed position relative the foot member 241. The rubber pad 245 provides frictional resistance to keep the enclosure apparatus in a fixed position. Each foot member 241 may be formed of rubber, plastic, metal, or any suitable material known in the art for adequately supporting a circuit board enclosure apparatus.

In another embodiment, a top cover 204 is configured to fit on a spacer 202 to further enclose a circuit board 207. The lower side of the top cover 204 includes an engagement portion 219 similar to those discussed above relating to FIGS. 1 through 4. Alternatively or in addition to the engagement portions, the lower side of the top cover 204 has apertures 233 that align with apertures 230, 231 in the spacer 202 or carrier 201 such that when a member 206 is threaded through the apertures 230, 231, 233, the top cover 204, spacer 202, and carrier 201 are aligned and secured relative to one another.

In one embodiment, the enclosure comprises a top cover 204, a base unit 203, at least one spacer 202, and at least one carrier 201. The spacer 202 and carrier 201 are assembled between the base unit 203 and top cover 204 to form an enclosure for the circuit board 207, which is mounted to the carrier 201. In addition, at least one recess 208 in the carrier 201 provides at least one vent for facilitating airflow across the circuit board 207 when the top cover 204 is mounted adjacent the carrier 201. The top cover 204, base unit 203, spacer 202, and carrier 201 are aligned and secured together using any of the engagement portions discussed above. For example, elongated members 206, such as posts or threaded members, extend through the foot members 241 and through apertures 232, 230, 231, 233 in the base unit 203, the spacer 202, the carrier 201, and the top cover 204, respectively, to hold the base unit 203, spacer 202, carrier 201, and top cover 204 in an aligned and stacked relationship relative to each other.

In a preferred embodiment as shown in FIGS. 7 and 8, the enclosure comprises a base unit 303, a top cover 304, and a plurality of stackable enclosure units 305. The base unit 303 has a floor 342 and wall 320 with an engagement portion 318 on the top edge of the wall 320. The top cover 304 has an engagement portion 319 defined on the lower side of the top cover 304. In one embodiment, the stackable enclosure units 305 include an integrated spacer 302 and carrier 301, as described in the embodiments relating to the discussion of FIGS. 1 and 2, or a separable spacer 302 and carrier 301 stacked together as described in the discussion relating to FIGS. 4 and 5. Each of the stackable enclosure units 305 has a wall 310 and has first 316 and second 317 engagement portions on the upper and lower sides of the wall 310, respectively.

The plurality of stackable enclosure units 305 assembled between the base unit 303 and the top cover 304 form an enclosure for circuit boards 307 that are mounted to the stackable enclosure units 305. The second engagement portion 317 of a stackable enclosure unit 305 engages with the first engagement portion 316 of another stackable enclosure unit 305 below it or the engagement portion 318 of a base unit 303. The first engagement portion 316 of the stackable enclosure unit 305 engages with either the second engagement portion 317 of another stackable enclosure unit 305 above it or the engagement portion 319 of the top cover 304. The engagement portions 316, 317, 318, 319 may be any of the engagement portion embodiments discussed above in reference to FIGS. 1 through 4.

In the preferred embodiment, the engagement portions 316, 317, 318, 319 include the combination of a lip and groove embodiment and an aperture and threaded member embodiment. The threaded member 306 is an elongated member that has a top end 345 and a bottom end 346. The top end 345 has a smaller diameter than the bottom end 346 and includes external threads. The bottom end 346 has an opening that includes internal threads for receiving the threaded top end 345 of another threaded member 306. To support an extension in height of the stackable enclosure that is higher than the length of a single member 306, the top end 345 of a first threaded member is engaged into the bottom end 346 of a second threaded member to form an elongated member. Additional threaded members can be added together to further support an extension in height of the stackable enclosure.

Any plurality of elongated members 306, such as posts or the threaded members discussed above, can extend through foot members 341 and apertures 332, 330, 333 of the base unit 303, stackable enclosure units 305, and the top cover 304, respectively. These members 306 hold the base unit 303, stackable enclosure units 305, and top cover 304 in an aligned and stacked relationship to each other.

Furthermore, each recess 308 in each stackable enclosure unit 305 provides a vent for facilitating airflow across the circuit boards 307 when another stackable enclosure unit 305 or a top cover 304 is stacked above it. When this vent feature is combined with a fan 340 in the base unit 303 and the flue-like openings 337 in the stackable enclosure units 305, airflow is significantly increased around the circuit boards 307, and the circuit boards 307 are adequately cooled. If the stackable enclosure units 305 are manufactured by a molding process, these recesses 308 can be easily integrated into mold. Additionally, the circuit boards 307 receive additional ventilation through the space reserved by the spacer portions of the stackable enclosure units 305 extending above and below each circuit board 307.

One embodiment of the base unit 303 includes at least one opening 321 in which an indicator light can be mounted and at least one opening 322 through which a cable can be run to enable communication between the circuit board 307 and an external device. In an alternative embodiment in which a stackable enclosure unit 305 is stacked relative to a base unit 303, the wall 310 of the stackable enclosure unit 305 can define a partial opening 311 that aligns with a partial opening 321 defined in a base unit 303 so that when the stackable enclosure unit 305 is stacked relative to the base unit 303 and the partial openings 311, 321 are aligned, an opening is formed into which a light can be mounted.

In another embodiment, in an embodiment where a stackable enclosure unit 305 is stacked relative to a base unit 303, the wall 310 of the stackable enclosure unit 305 can have a partial opening 312 that aligns with a partial opening 322 of a base unit 303 so that when the stackable enclosure unit 305 is stacked relative to the base unit 303 and the partial openings 312, 322 are aligned, at least one cable can be run through the partial openings 312, 322 to connect the circuit board 307 to an external device and enable communication between them. A further embodiment includes the use of a bushing 24 to further secure cables from the circuit board 307, such as the bushings 24 described above in relation to FIG. 3.

When the enclosure units 305 are stacked relative to one another, the circuit boards 307 attached to the stackable enclosure unit 305 may need to connect to one another to communicate with each other. In a preferred embodiment as shown in FIG. 9, each circuit board 307 has a first 350 bus connector and a second bus connector 360 on the upper and lower sides of the circuit board 307, respectively. Each stackable enclosure unit 305 has an opening 337 through which the circuit board connectors 350, 360 may pass, and each circuit board 307 is secured to a respective stackable enclosure unit 305 so that the connectors 350, 360 on the circuit board 307 extend through the openings 337 of the stackable enclosure unit 305. In an alternative embodiment, a second opening in addition to the opening 337 is defined by the stackable enclosure unit 305 through which connectors can extend.

In one embodiment, the first connector 350 on one circuit board 307 connects with a second bus connector 360 on a circuit board stacked above it and the second bus connector 360 of the circuit board 307 connects with a first bus connector 350 of a circuit board stacked below it to provide a bus connection that extends transversely through the circuit boards. The stackable enclosure units 305 are also adapted for enabling the first connector 350 to connect with the second connector 360 while continuing to let air flow around the circuit boards, such as through the flue-like opening 337 discussed above.

The enclosures in any of the above embodiments can be composed of metal, aluminum, plastic, or other suitably strong material known in the art for supported circuit boards.

This preferred embodiment can be advantageous for enclosing circuit boards used in a charged coupling device (CCD) camera controller. Several circuit boards can be utilized to control the CCD camera, and, depending upon the application to which the CCD camera is applied, these boards may need to be enclosed in a housing capable of protecting the boards from ambient conditions, while consuming as small of a footprint as possible and providing a cooling system for keeping the boards at an operable temperature. It is also desirable to have an enclosure that is easy to assemble. The invention, in its various embodiments, satisfies those needs. It allows the utilization of circuit boards that serve various functions, such as a command module, a clock driver module, a service module, at least one input module, and an output module. Additionally, the circuit board modules in the embodiments of the present invention have stackable bus connectors so that when a plurality of circuit boards are utilized, they can be stacked on top of one another to form a bus between the boards without taking up space bigger than the size of the footprint of only one board, regardless of how many boards are stacked together. Furthermore, the recesses formed in the carriers onto which the circuit boards are mounted facilitate airflow to or from the circuit boards, especially when a fan in the base unit is utilized to generate airflow in the enclosure, and this integrated cooling system keeps any number of circuit boards that are stacked together at an operable temperature. Finally, the invention provides an easy-to-assemble apparatus for enclosing a CCD camera controller because the units that comprise the apparatus are modular and stackable relative to one another, especially when utilizing the threaded member and aperture engaging embodiment.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An apparatus comprising:
a carrier defining at least one mounting portion configured to receive and removably secure a circuit board, and said carrier including at least one surface that defines at least one recess, said at least one recess comprising depressed portion in said at least one surface,
wherein said at least one recess facilitates airflow to or from a circuit board secured to said carrier when said carrier is stacked adjacent a second carrier.

2. The apparatus of claim 1 wherein said carrier further defines a wall for enclosing a circuit board.

3. The apparatus of claim 1 wherein said carrier further defines an opening through which a wire can be run to connect to the circuit board to transmit a signal to or from the circuit board to a device external to said apparatus.

4. The apparatus of claim 1 wherein said carrier further defines an opening in which an indicator light can be mounted.

5. The apparatus of claim 1 wherein said carrier is planar and has a rectangular portion having first and second relatively long sides and first and second relatively short sides, and a side portion dependent from at least one of said sides, said side portion defining said at least one recess.

6. The apparatus of claim 1 wherein the carrier is composed of metal.

7. The apparatus of claim 1 wherein the carrier is composed of aluminum.

8. The apparatus of claim 1 wherein the carrier is composed of plastic.

9. The apparatus of claim 1 wherein the carrier defines an opening sized to receive a circuit board of rectangular configuration measuring 100 millimeters on said relatively short sides, and 160 millimeters on said relatively long sides.

10. An apparatus comprising:
a spacer defining a wall and having an engagement portion; and
a carrier defining at least one mounting portion configured to receive a circuit board, and having an engagement portion adapted for mating with said spacer engagement portion to align said spacer and said carrier relative to one another.

11. The apparatus of claim 10 said carrier including at least one surface that defines at least one recess, said at least one recess comprising a depressed portion of said at least one surface,
wherein said at least one recess facilitates airflow to or from a circuit board secured to said carrier when said carrier is stacked adjacent a second spacer.

12. The apparatus of claim 10 wherein said spacer engagement portion defines at least one of a lip or a groove, said lip or groove configured to mate with at least one of a corresponding groove or a lip defined in said carrier engagement portion to secure said spacer and said carrier in a fixed relationship relative to one another.

13. The apparatus of claim 10 wherein said spacer farther defines an opening in which an indicator light can be mounted.

14. The apparatus of claim 10 wherein said spacer further defines an opening through which one or more wires can be run to connect the circuit board to a device external to said apparatus.

15. The apparatus of claim 10 further comprising;
a top cover configured to fit on said spacer to enclose a circuit board secured to said spacer.

16. The apparatus of claim 10 further comprising:
a base unit defining a wall configured to receive said spacer.

17. The apparatus of claim 16 wherein said base unit further comprises a fan for generating airflow to said circuit board secured to said spacer.

18. The apparatus of claim 16 wherein said base unit further defines an opening in which an indicator light can be mounted.

19. The apparatus of claim 16 wherein said base unit further defines an opening through which one or more wires can be run to connect the circuit board to a device external to said apparatus.

20. The apparatus of claim 10 further comprising:
a top cover configured to fit on a spacer to enclose a circuit board secured to the spacer; and
a base unit defining a wall configured to receive the spacer,
wherein the spacer and carrier are assembled between the base unit and top cover to form an enclosure for the circuit board mounted to the carrier and wherein the at least one recess in the carrier provides at least one vent for facilitating airflow across the circuit board.

21. The apparatus of claim 10 wherein said spacer is a first spacer and said carrier is a first carrier, said apparatus further comprising:
a second spacer and a second carrier, wherein:
said first spacer receives said first carrier and said second spacer receives said second carrier,
said second spacer and said second carrier are stacked in vertical succession on said first spacer and said first carrier; and
an opening defined by each of said carriers and spacers, said openings being positioned on said carriers and said spacers such that when said spacers and caters are stacked together, said openings define a flue through which air can flow.

22. The apparatus of claim 21 wherein each of said carriers further defines at least one recess for facilitating airflow to or from the carrier.

23. The apparatus of claim 21, further comprising a plurality of circuit boards, each circuit board having a different functionality from the other circuit boards, wherein a first circuit board chosen from said plurality of circuit boards is removably mounted to said first carrier and a second circuit board chosen from said plurality of circuit boards is removably mounted to said second carrier.

24. An apparatus comprising:
a base unit having a wall, said wall having a top edge that defines an engagement portion;
a top cover having an upper side and a lower side, said lower side defining an engagement portion; and
a plurality of stackable enclosure units each comprising a spacer and carrier, said spacer defining a wall and having first and second engagement portions on an upper side and a lower side of said spacer, respectively, and said carrier defining at least one mounting portion configured to receive a circuit board and having first and second engagement portions on an upper side and a lower side of said carrier, respectively;

wherein:
said second engagement portion of said spacer engages with said first engagement portion of said carrier;
said first engagement portion of said spacer engages with either said engagement portion of said top cover or said second engagement portion of said carrier of said stackable enclosure unit overlying said spacer;
said second engagement portion of said carrier engages with either said engagement portion of said base unit or said first engagement portion of said spacer of said stackable enclosure unit of said underlying stackable enclosure unit; and
the plurality of stackable enclosure units is assembled between the base unit and the top cover to form an enclosure for circuit boards mounted to the carriers.

25. The apparatus of claim 24 wherein said base unit further comprises a fan for generating airflow to the circuit board secured to said spacer.

26. The apparatus of claim 24 wherein said base unit defines an opening through which a wire can be run to connect the circuit board to a device external to said apparatus.

27. The apparatus of claim 26 further comprising: a bushing positioned in the opening of the base unit to secure the wires to the base unit.

28. The apparatus of claim 24 wherein said base unit further defines an opening in which an indicator light can be mounted.

29. The apparatus of claim 24 wherein each of said carriers further defines at least one recess along at least one side of said carrier to provide a vent for facilitating airflow across a circuit board mounted to said carrier.

30. The apparatus of claim 29 wherein:
each of said carriers and said spacers further define an opening through each of said carriers and said spacers such that when a plurality of said enclosure units are stacked together, said openings define a flue through which air can flow to cool circuit boards mounted to said carriers, and
said at least one recess on each of said carriers further facilitates the flow of air adjacent said carriers and through said flue.

31. The apparatus of claim 30, said base unit further comprising a fan, wherein said fan pulls air through said recesses, adjacent said circuit boards, and through said flue.

32. The apparatus of claim 24 wherein each of said carriers defines an opening, and wherein each of said spacers defines an opening, the apparatus further comprising:
a plurality of circuit boards, each circuit board secured to a respective carrier, each circuit board comprising first and second bus connectors on respective upper and lower sides thereof extending into respective openings of the carriers and spacers, the first connector connected to the second bus connector on a circuit board of an overlying stackable enclosure unit, if any, and the second bus connector mounted to the first bus connector of the circuit board associated with an underlying stackable enclosure unit, if any, to provide a bus connection extending through the circuit boards.

33. The apparatus of claim 24 further comprising:
a plurality of circuit boards, each circuit board secured to a respective carrier, each circuit board comprising first and second bus connectors on respective upper end lower sides thereof,
wherein each of said spacers and carriers are configured to allow said first connector to interconnect with said second connector when the stackable enclosure units are arranged in stacked relation to one another.

34. The apparatus of claim 24 further comprising:
a plurality of foot members mounted to the underside of the base unit, to support the apparatus.

35. The apparatus of claim 34 further comprising:
a plurality of posts extending through respective foot members and through apertures defined in the base unit, carriers and spacers of the stackable enclosure units, and the top cover, for holding the base unit, stackable enclosure units, and top cover together.

36. The apparatus of claim 35 wherein each of said posts comprises a top end and a bottom end, said top end being of lesser diameter than said bottom end, and said bottom end defining an opening for receiving a top end of a post, wherein the top end of a first post mates with the opening defined in the bottom end of a second post.

37. A method of enclosing a plurality of circuit boards, said method comprising the steps of:
selecting a plurality of circuit boards, said circuit boards having various functionalities;
mounting each of said selected circuit boards onto a carrier, said carrier including an engagement portion for receiving a mating engagement portion on a spacer, said spacer defining a wall;
joining said carrier engagement portion with said spacer engagement portion; and
stacking said joined carrier and spacer to produce an enclosure.

* * * * *

UNITED STATES PATENT AND TRADEMARK OFFICE
CERTIFICATE OF CORRECTION

PATENT NO. : 7,116,553 B2
APPLICATION NO. : 10/982070
DATED : October 3, 2006
INVENTOR(S) : Bleau et al.

It is certified that error appears in the above-identified patent and that said Letters Patent is hereby corrected as shown below:

Column 9,

Line 16, before "depressed" insert --a--;

Line 65, "farther" should read --further--.

Column 10,

Line 42, "caters" should read --carriers--.

Column 12,

Line 13, "end" should read --and--.

Signed and Sealed this

Sixth Day of March, 2007

JON W. DUDAS
*Director of the United States Patent and Trademark Office*